(12) United States Patent
Demir et al.

(10) Patent No.: US 7,280,812 B2
(45) Date of Patent: Oct. 9, 2007

(54) DIGITAL BASEBAND RECEIVER WITH DC DISCHARGE AND GAIN CONTROL CIRCUITS

(75) Inventors: Alpaslan Demir, Commack, NY (US); Leonid Kazakevich, Plainview, NY (US); Fatih Ozluturk, Port Washington, NY (US); Geetha Lakshmi Narayan, Holbrook, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 398 days.

(21) Appl. No.: 10/832,594

(22) Filed: Apr. 27, 2004

(65) Prior Publication Data

US 2005/0003777 A1 Jan. 6, 2005
US 2007/0010223 A9 Jan. 11, 2007

Related U.S. Application Data

(60) Provisional application No. 60/476,593, filed on Jun. 6, 2003.

(51) Int. Cl.
*H04B 7/00* (2006.01)
*H04B 7/16* (2006.01)
*H04B 1/16* (2006.01)

(52) U.S. Cl. .................. 455/232.1; 455/76; 455/78; 455/88; 455/208; 375/316; 375/324

(58) Field of Classification Search ............ 455/550.1, 455/554.2, 561, 95, 130, 232.1, 334, 344, 455/349
See application file for complete search history.

(56) References Cited

U.S. PATENT DOCUMENTS

| 5,640,698 | A | 6/1997 | Shen et al. |
|---|---|---|---|
| 5,675,287 | A | 10/1997 | Baker et al. |
| 6,449,465 | B1 | 9/2002 | Gailus et al. |
| 6,560,448 | B1 | 5/2003 | Baldwin et al. |
| 6,694,129 | B2 * | 2/2004 | Peterzell et al. ............. 455/76 |
| 6,700,514 | B2 * | 3/2004 | Soltanian et al. ........... 341/118 |
| 6,985,711 | B2 * | 1/2006 | Holenstein et al. ......... 455/312 |
| 2002/0160734 | A1 | 10/2002 | Li et al. |
| 2003/0063690 | A1 * | 4/2003 | Paulus et al. ............... 375/319 |

FOREIGN PATENT DOCUMENTS

| EP | 0594894 | 5/1994 |
|---|---|---|
| WO | 95/30275 | 11/1995 |
| WO | 00/72441 | 11/2000 |

\* cited by examiner

*Primary Examiner*—Tony T. Nguyen
(74) *Attorney, Agent, or Firm*—Volpe and Koenig, P.C.

(57) ABSTRACT

A digital baseband (DBB) receiver for receiving and processing a wireless communication signal. The DBB receiver includes at least one low noise amplifier (LNA), at least one demodulator, a direct current (DC) discharge circuit and an LNA control circuit. The LNA selectively amplifies the communication signal. The demodulator outputs analog real and imaginary signal components on real and imaginary signal paths, respectively, in response to receiving the communication signal from the LNA. The DC discharge circuit selectively discharges DC accumulating on at least one of the real and imaginary signal paths. The LNA control circuit turns the LNA on or off.

24 Claims, 5 Drawing Sheets

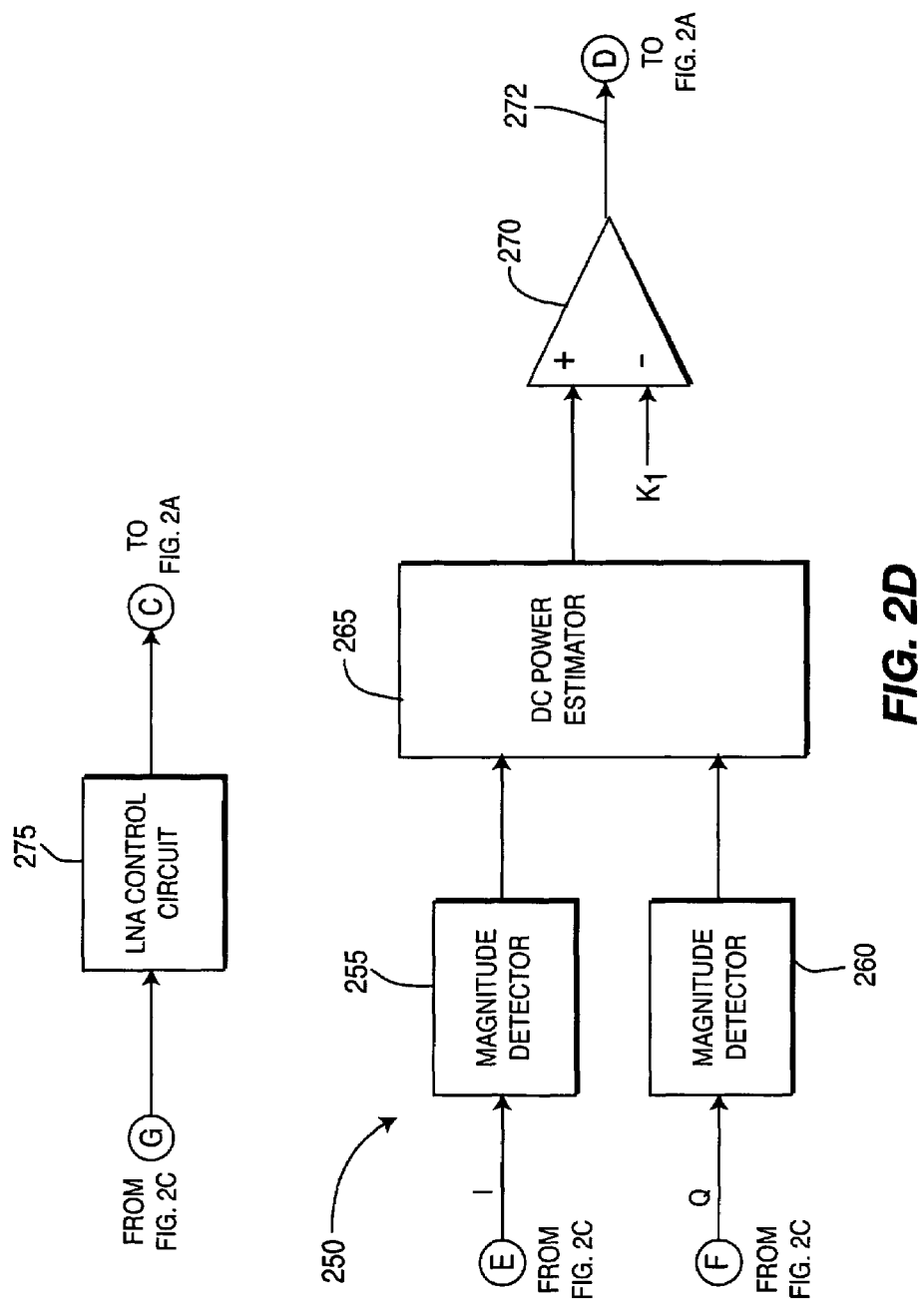

DIGITAL BASEBAND RECEIVER WITH DC DISCHARGE AND GAIN CONTROL CIRCUITS

CROSS REFERENCE TO RELATED APPLICATION

This application claims priority from U.S. Provisional Patent Application Ser. No. 60/476,593, filed Jun. 6, 2003, which is incorporated by reference as if fully set forth herein.

FIELD OF THE INVENTION

The present invention generally relates to receiver design in wireless communication systems. More particularly, the present invention relates to digital signal processing (DSP) techniques used to adjust gain and to compensate for direct current (DC) offset introduced into real and imaginary signal components processed by an analog radio receiver.

BACKGROUND

In conventional receivers, an analog gain control (AGC) loop is used to measure the instantaneous power as well as the average power received by an analog-to-digital converter (ADC). Based on the average power, the gain of the analog circuitry is adjusted such that the input to the ADC will stay within its predetermined dynamic range. In such conventional receivers, gain is controlled by a feedback loop which causes an undesired delay when adjusting the gain.

Figure 1:
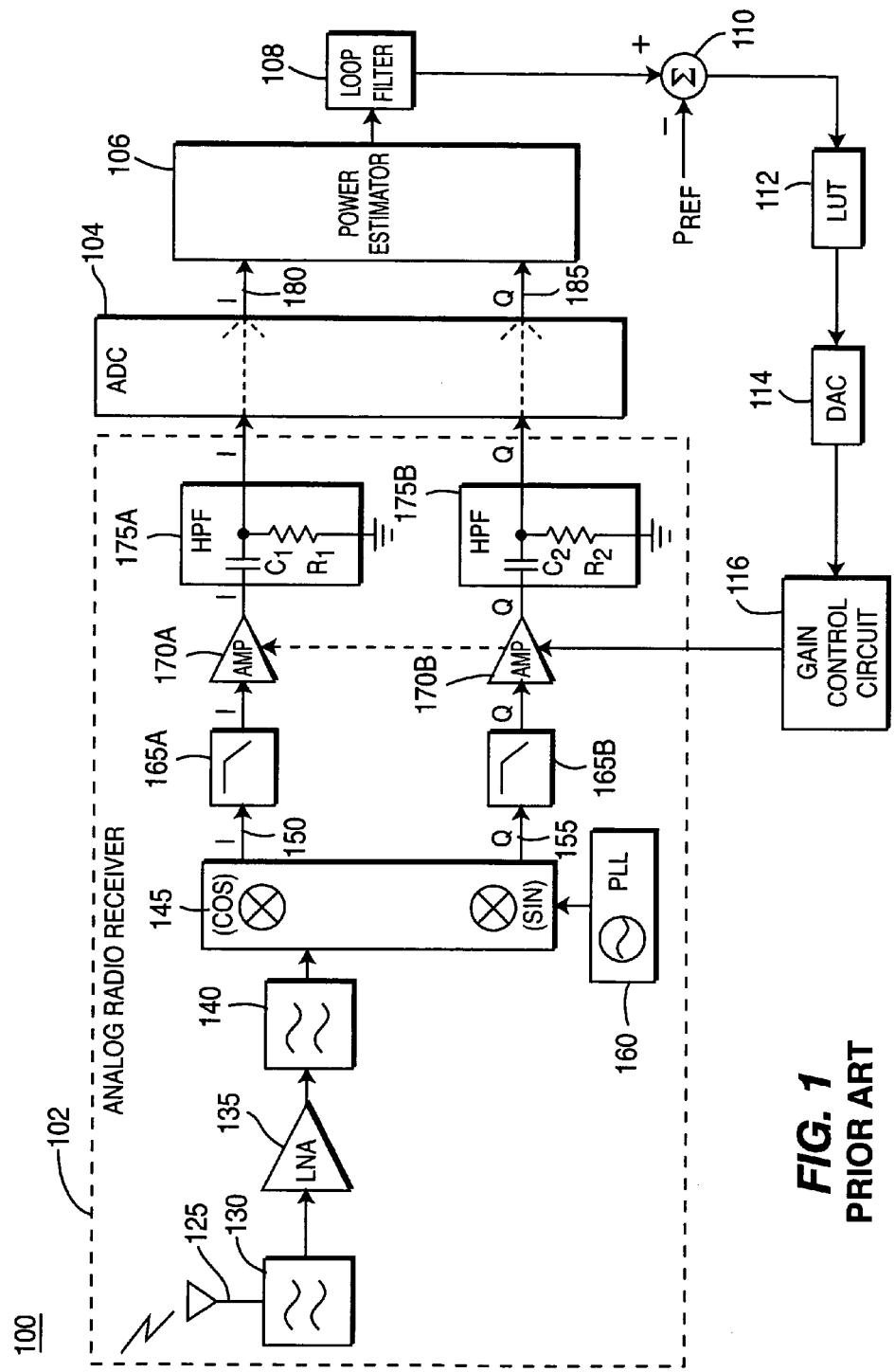

As shown in FIG. 1, a conventional radio frequency (RF) receiver 100 includes an analog radio receiver 102, at least one analog-to-digital converter (ADC) 104, and an analog gain control loop that measures the instantaneous power as well as the average power. The analog gain control loop includes a power estimator 106, a loop filter 108 (e.g., an LPF), a summer 110, a lookup table (LUT) 112, a digital-to-analog converter (DAC) 114 and a gain control circuit 116. The summer 110 adds a reference signal having a predetermined value $-P_{ref}$ to the output of the loop filter. The error voltage at the output of the summer 110 becomes zero when the average input power reaches the value of $P_{ref}$.

The analog radio receiver 102 is a direct conversion receiver which includes an antenna 125 for receiving a wireless communication signal, a bandpass filter 130, a low noise amplifier (LNA) 135, an optional second filter 140 (e.g., bandpass filter), a demodulator 145 having two outputs 150, 155, a phase-locked loop (PLL) 160, an analog real signal path low pass filter (LPF) 165A, an analog imaginary signal path LPF 165B, at least one real signal path amplifier 170A, at least one imaginary signal path amplifier 170B, at least one analog real signal path high pass filter (HPF) circuit 175A, and at least one analog imaginary signal path HPF circuit 175B. Each of the amplifiers 170A, 170B, includes a high gain stage residing in the analog domain of the RF receiver 100.

The PLL 160 generates a local oscillator (LO) signal to control the two outputs 150, 155 of the demodulator 145. The output 150 is an in-phase (I) output of the demodulator 145 for outputting a real signal component of the wireless communication signal. The output 155 is a quadrature (Q) output of the demodulator 145 for outputting an imaginary signal component of the wireless communication signal. The analog LPFs 165A, 165B, control the bandwidth selectivity of the I and Q outputs 150 and 155, respectively. The outputs of the analog LPFs 165A, 165B, are then amplified by the amplifiers 170A, 170B, respectively.

Due to high gain requirements, the analog HPF circuits 175A, 175B, are included in the analog radio receiver 102 to provide capacitance after each of the amplifiers 170A, 170B, respectively, whereby the amplifiers 170A, 170B, are AC-coupled and any residual direct current (DC) is removed to prevent DC offset. Each of the analog HPF circuits 175A, 175B, has a signal input, a signal output, at least one capacitor $C_1$, $C_2$, which connects the signal input to the signal output, and at least one resistor $R_1$, $R_2$, which connects the output of the capacitor to ground, thus forming an R-C filter. The analog HPF circuits 175A, 175B, alter the spectral shape (i.e., reducing the energy) of the lower portion (e.g., below 50 kHz) of the frequency domain response associated with the real and imaginary signal components.

In the conventional RF receiver 100 of FIG. 1, the ADC 104 is connected to the output of the analog HPF circuits 175A, 175B. The analog HPF circuits 175A, 175B, are utilized to guarantee the spectral shape of the wireless communication signal received via the antenna 125 before being sampled at the ADC 104. The ADC 104 outputs digital I and Q outputs 180, 185, to the power estimator 106 which, for example, performs a function in which $I^2+Q^2$ is calculated.

In the RF receiver 100, the reaction time necessary to adjust the gain of the amplifiers 170A, 170B, to respond to large changes in the gain of signals received at the antenna 125 is considerable. The gain adjustment of the amplifiers 170A, 170B, is based on a feedback loop which includes a power estimator 106, a loop filter 108, a summer 110, look up table (LUT) 112, a digital-to-analog converter (DAC) 114 and a gain control circuit 116. A reference power ($P_{REF}$) value is subtracted from the output of the loop filter via the summer 110 to generate an error signal 118. Based on the error signal 118, the LUT 112 sets the DAC 114 to a predetermined setting such that the gain control circuit 116 adjusts the gain of the amplifiers 170A, 170B accordingly. Furthermore, because the potential range of the input signal variation received at the antenna 125 of the analog radio receiver 102 may be very large (e.g., a 75 dB dynamic range), a very large capacity and expensive ADC 104 (e.g., having 13 bits whereby 6 dB dynamic range is provided per bit) is required. The ADC 104 will also consume considerable power.

It is desirable to provide a method of addressing DC offset cancellation and gain control without the disadvantages addressed above.

SUMMARY

The present invention is a digital baseband (DBB) receiver for receiving and processing a wireless communication signal. The DBB receiver includes at least one low noise amplifier (LNA), at least one demodulator, a direct current (DC) discharge circuit and an LNA control circuit. The LNA selectively amplifies the communication signal. The demodulator outputs analog real and imaginary signal components on real and imaginary signal paths, respectively, in response to receiving the communication signal from the LNA. The DC discharge circuit selectively discharges DC accumulating on at least one of the real and imaginary signal paths. The LNA control circuit turns the LNA on or off.

The DBB receiver may further include a first high pass filter (HPF) circuit in communication with the real signal path and a second HPF circuit in communication with the imaginary signal path. Each of the first and second HPF circuits may include at least one capacitor, at least one resistor and at least one transistor in parallel with the resistor. Each transistor may be controlled by the DC discharge circuit to selectively flush accumulated DC from the respective capacitor to ground.

Alternatively, each of the first and second HPF circuits may include at least one capacitor, at least one resistor and at least one switch in parallel with the resistor. Each switch may be controlled by the DC discharge circuit to selectively flush accumulated DC from the respective capacitor to ground.

The DBB receiver may further include a first digital gain control circuit having an input in communication with the first HPF circuit, and a second digital gain control circuit having an input in communication with the second HPF circuit. The DBB receiver may further include a DC offset and normalization compensation module in communication with respective outputs of the first and second digital gain circuits, an input to the DC discharge circuit and an input to the LNA control circuit. The DC offset and normalization compensation module may be configured to maintain the output of the DBB receiver at a constant output power level.

BRIEF DESCRIPTION OF THE DRAWING(S)

A more detailed understanding of the invention may be had from the following description of a preferred example, given by way of example and to be understood in conjunction with the accompanying drawing wherein:

FIG. 1 is a block diagram of a conventional RF receiver including an analog radio receiver; and FIGS. 2A, 2B, 2C and 2D, taken together, are a block diagram of a DBB RF receiver with a digital DC offset and normalization compensation module configured in accordance with a preferred embodiment of the present invention.

DETAILED DESCRIPTION OF THE PREFERRED EMBODIMENTS

Preferably, the method and system disclosed herein is incorporated into a wireless transmit/receive unit (WTRU). Hereafter, a WTRU includes but is not limited to a user equipment, mobile station, fixed or mobile subscriber unit, pager, or any other type of device capable of operating in a wireless environment. The features of the present invention may be incorporated into an integrated circuit (IC) or be configured in a circuit comprising a multitude of interconnecting components.

The present invention is applicable to communication systems using time division duplex (TDD), time division multiple access (TDMA), frequency division duplex (FDD), code division multiple access (CDMA), CDMA 2000, time division synchronous CDMA (TDSCDMA), and orthogonal frequency division multiplexing (OFDM). However, the present invention is envisaged to be applicable to other types of communication systems as well.

FIGS. 2A, 2B, 2C and 2D, taken together, illustrate the overall architecture of a digital baseband (DBB) receiver 200 operating in accordance with the preferred embodiment of the present invention. A mapping is used to normalize the input. The receiver 200 includes an analog radio receiver 202 (see FIG. 2A), a real signal path digital gain control circuit 205A, an imaginary signal path digital gain control circuit 205B, respective LPFs 245A, 245B, a digital direct current (DC) offset and normalization compensation module 300, a DC-discharge flag circuit 250 and an LNA control circuit 275 (see FIG. 2B). The DC-discharge flag circuit 250 is used to flush out DC accumulated in the real and imaginary signal component paths when a predetermined threshold is exceeded. Furthermore, if the input power to the analog radio receiver 202 is very low, the LNA control circuit 275 turns on the LNA 135 and, if the input power to the analog radio receiver 202 is very high, the LNA control circuit 275 turns off the LNA 135.

In receiver 200, full dynamic range is provided using a normalization process without the use of a DAC, such as the one used in the prior art system 100 illustrated in FIG. 1.

Figure 2A:
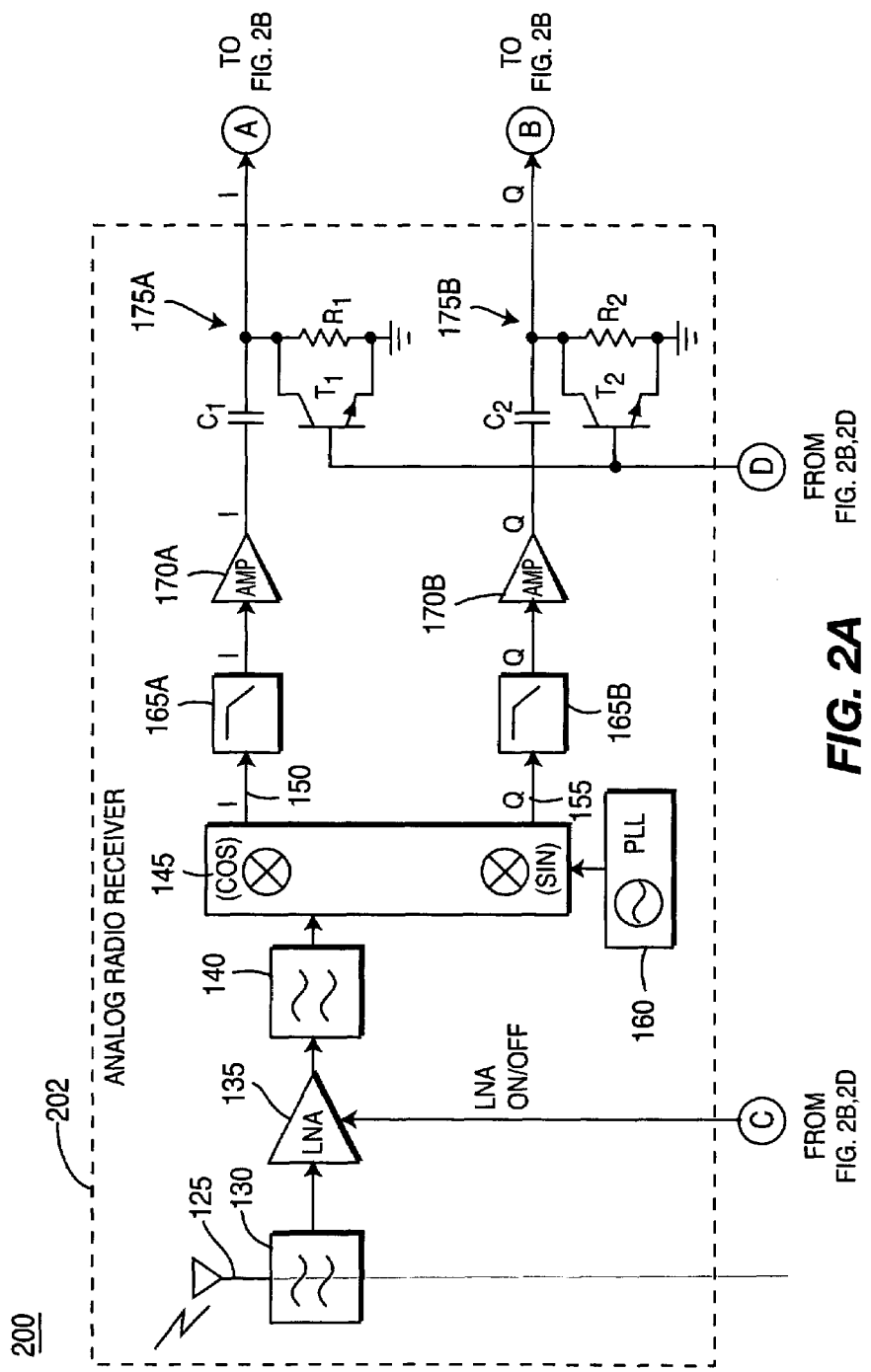

As shown in FIG. 2A, the analog radio receiver 202 is a direct conversion receiver which includes an antenna 125 for receiving a wireless communication signal, a bandpass filter 130, an LNA 135, an optional second filter 140 (e.g., bandpass filter), a demodulator 145 having two outputs 150, 155, a PLL 160, an analog real signal path LPF 165A, an analog imaginary signal path LPF 165B, at least one real signal path amplifier 170A, at least one imaginary signal path amplifier 170B, at least one analog real signal path high pass filter (HPF) circuit 175A, and at least one analog imaginary signal path HPF circuit 175B. Each of the amplifiers 170A, 170B, include a high gain stage residing in the analog domain of the analog radio receiver 202. Each of the HPF circuits 175A, 175B, include at least one capacitor $C_1$, $C_2$, at least one resistor $R_1$, $R_2$ and at least one transistor $T_1$, $T_2$, for selectively grounding the output of the respective capacitor $C_1$, $C_2$, to eliminate DC offsets accumulating thereof. Alternatively, one or more switches may be used to short the outputs of the capacitors $C_1$, $C_2$, of the HPF circuits 175A, 175B, to ground.

Figure 2B:
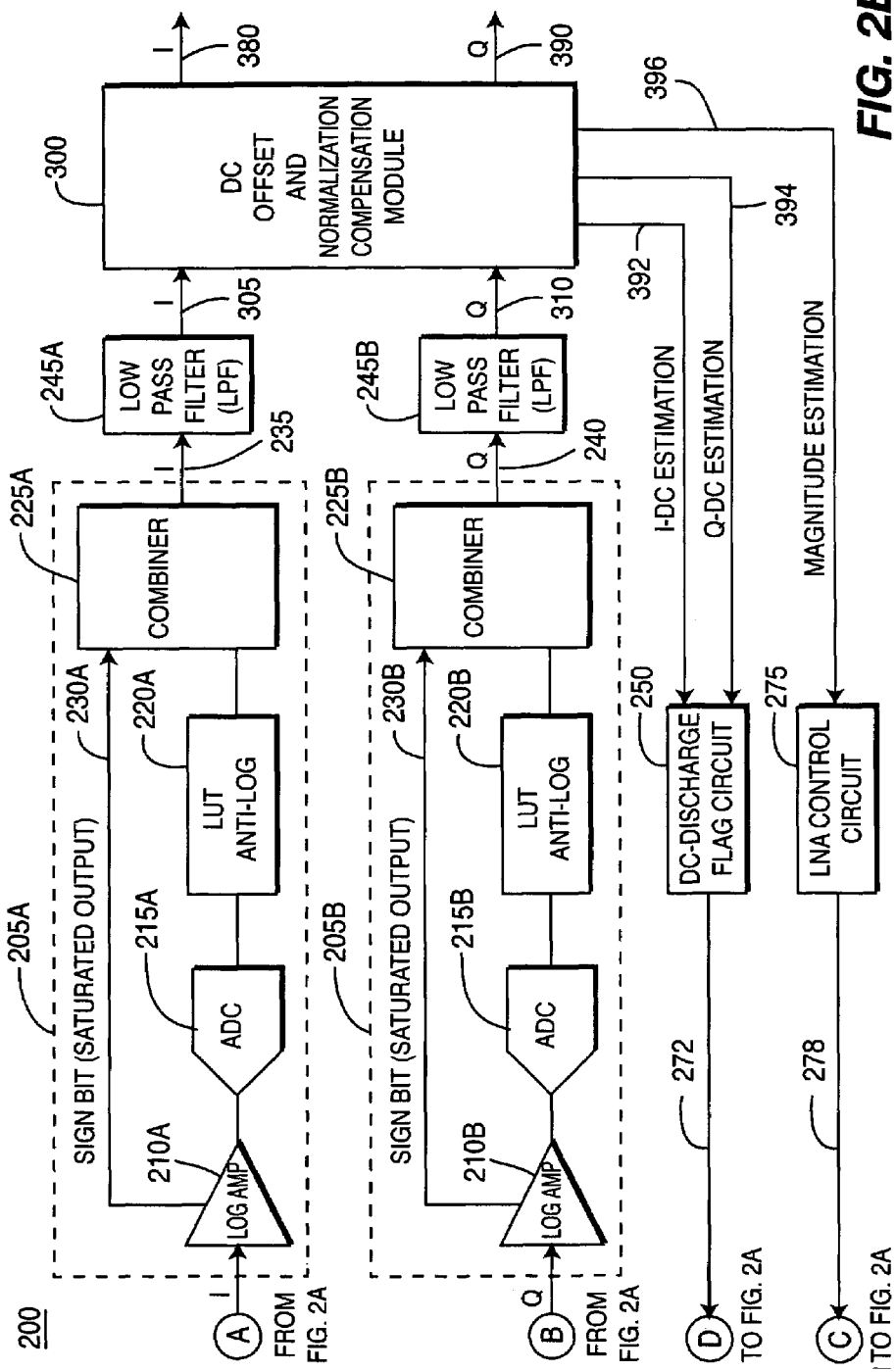

As shown in FIG. 2B, the digital DC offset and normalization compensation module 300 has a real signal input 305 connected to the real signal path digital gain control circuit 205A via the LPF 245A, and an imaginary signal input 310 connected to the imaginary signal path digital gain control circuit 205B via the LPF 245B. The digital DC offset and normalization compensation module 300 further includes real and imaginary compensated signal outputs 380, 390. The digital DC offset and normalization compensation module 300 also outputs a DC estimation signal 392 for the real signal path 305, a DC estimation signal 394 for the imaginary signal path 310, and a magnitude estimation signal 396. The DC estimation signals 392, 394 are received by the DC-discharge flag circuit 250 which, in turn, outputs a control signal when it is determined that DC on $C_1$ and $C_2$ in the analog radio receiver 202 shown in FIG. 2A should be dissipated. The magnitude estimation signal 396 is received by the LNA control circuit 275 which, in turn, outputs a control signal to turn on or off the LNA 135 in the analog radio receiver 202 shown in FIG. 2A.

Referring to FIG. 2B, each of digital gain control circuits 205A, 205B, include a logarithmic amplifier 210A, 210B, or other amplifier with known compression characteristics for compressing the input analog signals received from analog radio receiver 202 from a wider dynamic range to a lower dynamic range. In other words, the logarithmic amplifiers 210A, 210B, apply a particular level of amplification to the analog real (I) and imaginary (Q) signal components in accordance with their amplitude. Each of the digital gain control circuits 205A, 205B, further includes an ADC 215A, 215B, a look up table (LUT) 220A, 220B, and a combiner 225A, 225B. The LUTs 220A, 220B, provide an anti-log function used to decompress the converted digital signals based on previously captured compression curve data. The ADCs 215A, 215B, digitize the outputs of the logarithmic amplifiers 210A, 210B, and provide the digitized outputs to the LUTs or anti-log functions 225A, 225B, in order to decipher the digital domain of the analog real and imaginary signal components. The outputs of the ADCs 215A, 215B, are converted to a linear scale by generating (2*n−1) bit signals. It may be necessary to add one or more additional gain stages before each logarithmic amplifier 215A, 215B, if the existing gain is not sufficient to promote saturation. The combiners 225A, 225B, combine the digitized outputs of the LUTs 220A, 220B, with sign bits 230A, 230B, provided by saturated outputs of the logarithmic amplifiers 210A, 210B, to generate a digital real signal component 235 and a digital imaginary signal component 240. The sign bits 230A, 230B, are created from saturated outputs of logarithmic amplifiers 210A, 210B, respectively.

The digital gain control circuits 205A, 205B, are used to compensate for channel loss variation and to support a large dynamic range of incoming signals (e.g., from −100 dBm to −25 dBm). The digital gain control circuits 205A, 205B, are also used to minimize the number of bits required for operating the ADCs 215A, 215B, and are designed to efficiently compensate for channel loss variation in an expeditious manner, without distorting the signal envelope. The digital gain control circuits 205A, 205B, have a linear response, in dB-per-volt. In a closed loop system, the digital gain control circuits 205A, 205B, are used to maintain functions such as stability, settling time, overshoot, etc.

Figure 2C:
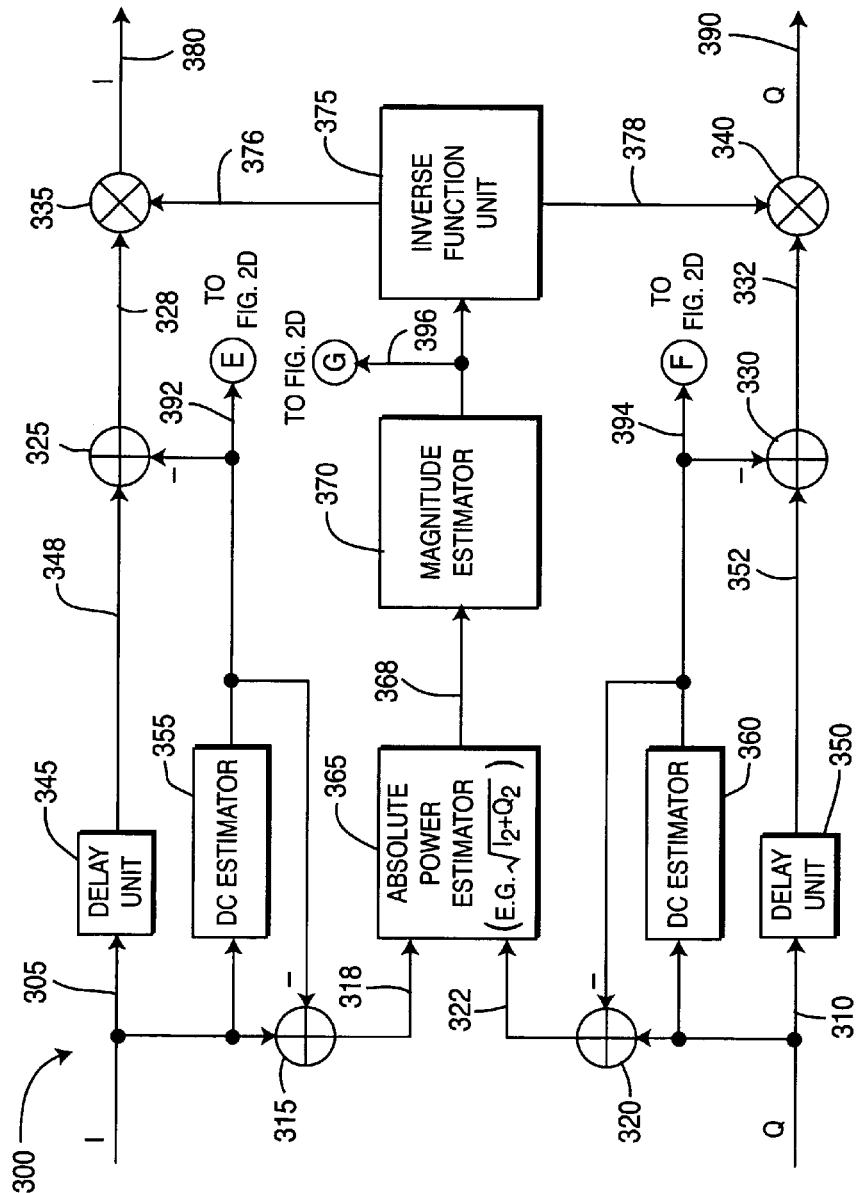

FIG. 2C shows the architecture for the digital DC offset and normalization compensation module 300. The digital DC offset and normalization compensation module 300 includes real and imaginary signal component inputs 305, 310, adders 315, 320, 325, 330, multipliers 335, 340, delay units 345, 350, DC estimators 355, 360, absolute power estimator 365, magnitude estimator 370 and inverse function unit 375. The real (I) signal component input 305 is connected to an input of the delay unit 345, the DC estimator 355 and the summer 315. The imaginary (Q) signal component input 310 is connected to an input of the delay unit 350, the DC estimator 360 and the summer 320.

The DC estimator 355 outputs a signal 392 to an input of the summers 315, 325, and to the DC-discharge flag circuit 250. The summer 325 subtracts the signal 392 from a delayed real signal component 348 outputted by the delay unit 345 and outputs a resulting real signal 328 free of a DC offset. The DC estimator 360 outputs a signal 394 to an input of the summers 320, 330, and to the DC-discharge flag circuit 250. The summer 330 subtracts the signal 394 from a delayed real signal component 352 outputted by the delay unit 350 and outputs a resulting imaginary signal 332 free of a DC offset. Each of the DC estimators 355, 360 take a substantial amount of time to converge. Thus the delay units 355, 360, are used to compensate for the delay in generating an estimation of the DC level on the real and imaginary signal component inputs 305, 310, respectively.

When the signal 392 indicates that the DC level on the real (I) or imaginary (Q) signal component inputs 305, 310, exceeds a predetermined value, the DC-discharge flag circuit causes the transistors $T_1$, $T_2$, in the analog radio receiver 202 to discharge any DC stored in the capacitors $C_1$, $C_2$.

In one embodiment, switches may be substituted for the transistors $T_1$, $T_2$, used in the analog radio receiver 202 whereby any DC stored in the capacitors $C_1$, $C_2$ is selectively discharged to ground. In another embodiment, when the present invention is implemented by a time-slotted system (e.g., TDD, TDMA), the discharge of the capacitors $C_1$ and $C_2$ only takes place during a guard period which occurs between time slots, such that the transmission of data is not interfered with.

Still referring to FIG. 2C, the output of the DC estimator 355 is subtracted from the real (I) signal component input 305 via the summer 315 which outputs a result 318 to the absolute power estimator 365. The output 368 of the DC estimator 360 is subtracted from the imaginary (Q) signal component input 310 via the summer 320 which outputs a result 322 to the absolute power estimator 365 which performs a function based on the results 318 and 322 (e.g., $\sqrt{I^2+Q^2}$). The output of the absolute power estimator is fed to the magnitude estimator which outputs an averaged magnitude estimation signal 396 (e.g., $E(|\sqrt{I^2+Q^2}|)$) to the LNA control circuit 275 and to the inverse function unit 375 which determines the inverse of the estimated power (e.g., $1/E(|\sqrt{I^2+Q^2}|)$) such that the output power is maintained at a constant level.

The inverse function unit 375 outputs inverse power estimation signals 376, 378, to respective inputs of the multipliers 335, 340. The multiplier 335 multiplies the resulting signal 328 by the signal 376 to provide a compensated real signal component output 380. The multiplier 340 multiplies the resulting signal 332 by the signal 376 to provide a compensated imaginary signal component output 380.

FIG. 2D shows the architecture for the DC-discharge flag circuit 250. The DC-discharge flag circuit 250 includes real and imaginary magnitude detectors 255, 260, a DC power estimator 265 and a comparator 270 which compares the output of the DC power estimator with a predetermined threshold $K_1$. The comparator 270 selectively outputs a control signal causing switches S1 and S2 in the analog radio receiver 202 to close when the output of the DC power estimator exceeds the predetermined threshold $K_1$.

While this invention has been particularly shown and described with reference to preferred embodiments, it will be understood by those skilled in the art that various changes in form and details may be made therein without departing from the scope of the invention described hereinabove.

What is claimed is:

1. A digital baseband (DBB) receiver comprising:
   (a) means for amplifying an incoming signal;
   (b) means for generating real and imaginary analog signal components based on the incoming signal;
   (c) means for digitizing the signal components;
   (d) means for providing an estimate of the direct current (DC) residing on each of the digitized components;
   (e) means for subtracting the DC estimates from each respective one of the digitized signal components to provide an adjusted real signal component and an adjusted imaginary signal component;
   (f) means for providing estimates of the absolute power and magnitude of the adjusted signal components; and
   (g) means for enabling or disabling the amplifying means based on the absolute power and magnitude estimate.

2. The DBB receiver of claim 1 wherein means (a)-(g) are incorporated in an integrated circuit (IC) which is comprised by the DBB receiver.

3. The DBB receiver of claim 1 wherein means (a)-(g) are incorporated in a wireless transmit/receive unit (WTRU) which comprises the DBB receiver.

4. In a digital baseband (DBB) receiver for receiving and processing an incoming signal, a method comprising:
   (a) generating real and imaginary analog signal components based on the incoming signal;
   (b) digitizing the signal components;
   (c) providing an estimate of the direct current (DC) residing on each of the digitized components;

(d) subtracting the DC estimates from each respective one of the digitized signal components to provide an adjusted real signal component and an adjusted imaginary signal component;

(e) providing estimates of the absolute power and magnitude of the adjusted signal components; and (f) selectively amplifying the incoming signal based on the absolute power and magnitude estimate.

5. A digital baseband (DBB) receiver for receiving and processing an incoming signal, the receiver comprising:

(a) means for generating real and imaginary analog signal components based on the incoming signal;

(b) means for digitizing the signal components;

(c) means for providing an estimate of the direct current (DC) power residing on each of the digitized components;

(d) means for comparing the DC power estimate to a predetermined value; and (e) means for selectively discharging DC from the digitized components based on the difference between the DC power estimate and the predetermined value.

6. The DBB receiver of claim 5 wherein means (a)-(e) are incorporated in an integrated circuit (IC) which is comprised by the DBB receiver.

7. The DBB receiver of claim 5 wherein means (a)-(e) are incorporated in a wireless transmit/receive unit (WTRU) which comprises the DBB receiver.

8. In a digital baseband (DBB) receiver for receiving and processing an incoming signal, a method comprising:

(a) generating real and imaginary analog signal components based on the incoming signal;

(b) digitizing the signal components;

(c) providing an estimate of the direct current (DC) power residing on each of the digitized components;

(d) comparing the DC power estimate to a predetermined value; and (e) selectively discharging DC from the digitized components based on the difference between the DC power estimate and the predetermined value.

9. A digital baseband (DBB) receiver for receiving and processing a wireless communication signal, the DBB receiver comprising:

(a) at least one low noise amplifier (LNA) which selectively amplifies the communication signal;

(b) at least one demodulator which outputs analog real and imaginary signal components on real and imaginary signal paths, respectively, in response to receiving the communication signal from the LNA;

(c) a direct current (DC) discharge circuit for selectively discharging direct current accumulating on at least one of the real and imaginary signal paths;

(d) an LNA control circuit for turning the LNA on or off;

(e) a first high pass filter (HPF) circuit in communication with the real signal path; and (f) a second HPF circuit in communication with the imaginary signal path, wherein each of the first and second HPF circuits includes at least one capacitor and at least one switch in parallel with the capacitor, the switches being controlled by the DC discharge circuit to selectively flush accumulated DC from the capacitors.

10. The DBB receiver of claim 9 further comprising:

(g) a first digital gain control circuit having an input in communication with the first HPF circuit;

(h) a second digital gain control circuit having an input in communication with the second HPF circuit; and (i) a DC offset and normalization compensation module in communication with respective outputs of the first and second digital gain circuits, an input to the DC discharge circuit and an input to the LNA control circuit, wherein the DC offset and normalization compensation module maintains the output of the DBB receiver at a constant output power level.

11. The DBB receiver of claim 9 wherein the LNA, the demodulator, the DC discharge circuit and the LNA control circuit are incorporated in an integrated circuit (IC) which is comprised by the DBB receiver.

12. The DBB receiver of claim 9 wherein the LNA, the demodulator, the DC discharge circuit and the LNA control circuit are incorporated in a wireless transmit/receive unit (WTRU) which comprises the DBB receiver.

13. A digital baseband (DBB) receiver for receiving and processing a wireless communication signal, the DBB receiver comprising:

(a) at least one low noise amplifier (LNA) which selectively amplifies the communication signal;

(b) at least one demodulator which outputs analog real and imaginary signal components on real and imaginary signal paths, respectively, in response to receiving the communication signal from the LNA;

(c) a direct current (DC) discharge circuit for selectively discharging direct current accumulating on at least one of the real and imaginary signal paths;

(d) an LNA control circuit for turning the LNA on or off;

(e) a first high pass filter (HPF) circuit in communication with the real signal path; and (f) a second HPF circuit in communication with the imaginary signal path, wherein each of the first and second HPF circuits includes at least one capacitor and at least one transistor in communication with the capacitor, the transistors being controlled by the DC discharge circuit to selectively flush accumulated DC from the capacitors.

14. The DBB receiver of claim 13 further comprising:

(g) a first digital gain control circuit having an input in communication with the first HPF circuit;

(h) a second digital gain control circuit having an input in communication with the second HPF circuit; and (i) a DC offset and normalization compensation module in communication with respective outputs of the first and second digital gain circuits, an input to the DC discharge circuit and an input to the LNA control circuit, wherein the DC offset and normalization compensation module maintains the output of the DBB receiver at a constant level.

15. The DBB receiver of claim 13 wherein the demodulator and the DC discharge circuit are incorporated in an integrated circuit (IC) which is comprised by the DBB receiver.

16. The DBB receiver of claim 13 wherein the demodulator and the DC discharge circuit are incorporated in a wireless transmit/receive unit (WTRU) which comprises the DBB receiver.

17. A digital baseband (DBB) receiver for receiving and processing a wireless communication signal, the DBB receiver comprising:

(a) at least one demodulator which outputs analog real and imaginary signal components on real and imaginary signal paths, respectively, in response to receiving the communication signal;

(b) a direct current (DC) discharge circuit for selectively discharging direct current accumulating on at least one of the real and imaginary signal paths;

(c) a first high pass filter (HPF) circuit in communication with the real signal path; and (d) a second HPF circuit in communication with the imaginary signal path, wherein each of the first and second HPF circuits includes at least one capacitor and at least one switch in parallel with the capacitor, the switches being controlled by the DC discharge circuit to selectively flush accumulated DC from the capacitors.

18. The DBB receiver of claim 17 further comprising:

(e) a first digital gain control circuit having an input in communication with the first HPF circuit;

(f) a second digital gain control circuit having an input in communication with the second HPF circuit; and (g) a DC offset and normalization compensation module in communication with respective outputs of the first and second digital gain circuits and an input to the DC discharge circuit, wherein the DC offset and normalization compensation module maintains the output of the DBB receiver at a constant output power level.

19. The DBB receiver of claim 17 wherein the demodulator and the DC discharge circuit are incorporated in an integrated circuit (IC) which is comprised by the DBB receiver.

20. The DBB receiver of claim 17 wherein the demodulator and the DC discharge circuit are incorporated in a wireless transmit/receive unit (WTRU) which comprises the DBB receiver.

21. A digital baseband (DBB) receiver for receiving and processing a wireless communication signal, the DBB receiver comprising:

(a) at least one demodulator which outputs analog real and imaginary signal components on real and imaginary signal paths, respectively, in response to receiving the communication signal;

(b) a direct current (DC) discharge circuit for selectively discharging direct current accumulating on at least one of the real and imaginary signal paths;

(c) a first high pass filter (HPF) circuit in communication with the real signal path; and (d) a second HPF circuit in communication with the imaginary signal path, wherein each of the first and second HPF circuits includes at least one capacitor and at least one transistor in communication with the capacitor, the transistors being controlled by the DC discharge circuit to selectively flush accumulated DC from the capacitors.

22. The DBB receiver of claim 21 further comprising:

(e) a first digital gain control circuit having an input in communication with the first HPF circuit;

(f) a second digital gain control circuit having an input in communication with the second HPF circuit; and (g) a DC offset and normalization compensation module in communication with respective outputs of the first and second digital gain circuits and an input to the DC discharge circuit, wherein the DC offset and normalization compensation module maintains the output of the DBB receiver at a constant level.

23. The DBB receiver of claim 21 wherein the demodulator and the DC discharge circuit are incorporated in an integrated circuit (IC) which is comprised by the DBB receiver.

24. The DBB receiver of claim 21 wherein the demodulator and the DC discharge circuit are incorporated in a wireless transmit/receive unit (WTRU) which comprises the DBB receiver.

* * * * *

UNITED STATES PATENT AND TRADEMARK OFFICE
CERTIFICATE OF CORRECTION

PATENT NO. : 7,280,812 B2  Page 1 of 1
APPLICATION NO. : 10/832594
DATED : October 9, 2007
INVENTOR(S) : Demir et al.

It is certified that error appears in the above-identified patent and that said Letters Patent is hereby corrected as shown below:

At column 6, line 22, after the second use of the word "signal", delete "376" and insert therefor --378--.

At column 6, line 24, delete "380." and insert therefor --390.--.

Signed and Sealed this

Twenty-fifth Day of March, 2008

JON W. DUDAS
*Director of the United States Patent and Trademark Office*